(12) United States Patent
Patella et al.

(10) Patent No.: US 7,100,097 B2
(45) Date of Patent: *Aug. 29, 2006

(54) DETECTION OF BIT ERRORS IN MASKABLE CONTENT ADDRESSABLE MEMORIES

(75) Inventors: Benjamin J. Patella, Fort Collins, CO (US); Ronny Lee Arnold, Fort Collins, CO (US); Cameron B. McNairy, Fort Collins, CO (US); Kevin David Safford, Fort Collins, CO (US)

(73) Assignees: Hewlett-Packard Development Company, L.P., Houston, TX (US); Intel Corporation, Santa Clara, CA (US)

(*) Notice: Subject to any disclaimer, the term of this patent is extended or adjusted under 35 U.S.C. 154(b) by 495 days.

This patent is subject to a terminal disclaimer.

(21) Appl. No.: 10/196,763

(22) Filed: Jul. 16, 2002

(65) Prior Publication Data

US 2004/0015752 A1    Jan. 22, 2004

(51) Int. Cl.
*G11C 29/00* (2006.01)

(52) U.S. Cl. .................. 714/718; 714/763; 714/773; 714/768

(58) Field of Classification Search ............. 714/768, 714/758, 800, 718, 763, 801, 805, 819, 773, 714/18, 716
See application file for complete search history.

(56) References Cited

U.S. PATENT DOCUMENTS 4,065,756 A * 12/1977 Panigrahi .................... 365/49
4,996,666 A * 2/1991 Duluk, Jr. .................... 365/49
5,453,999 A * 9/1995 Michaelson et al. ........ 714/805
6,067,656 A * 5/2000 Rusu et al. .................. 714/768
6,430,073 B1 * 8/2002 Batson et al. ................. 365/49
6,535,452 B1 * 3/2003 Okuda et al. .......... 365/230.03
6,657,878 B1 * 12/2003 Lien et al. .................... 365/49
6,700,827 B1 * 3/2004 Lien et al. ................... 365/222
6,718,494 B1 * 4/2004 Jamil et al. ................. 714/723

* cited by examiner

*Primary Examiner*—Guy Lamarre
*Assistant Examiner*—Fritz Alphonse
(74) *Attorney, Agent, or Firm*—Alexander J. Neudeck

(57) ABSTRACT

Parity and mask bit(s) are stored in a random access memory (RAM) that is coupled to a CAM. This CAM may be part of a TLB. The parity and mask bits(s) are stored in conjunction with the CAM entry write. Upon a CAM query match, the reference parity bit(s) and mask bit(s) stored at the address output by the CAM are output from the RAM. These reference parity bit(s) are compared to parity bit(s) generated from a query data value that is masked by the retrieved mask bit(s). In the absence of a CAM or RAM bit error, the reference parity bit(s) from the RAM and the parity bit(s) generated from the masked query data will match. If a CAM or RAM bit error occurred, these two sets of parity bit(s) will not match and thus an error will be detected. This error may be used as an indication that a false CAM match has occurred.

20 Claims, 4 Drawing Sheets

DETECTION OF BIT ERRORS IN MASKABLE CONTENT ADDRESSABLE MEMORIES

CROSS-REFERENCE TO RELATED APPLICATIONS

A copending United States patent application commonly owned by the assignee of the present document and incorporated by reference in its entirety into this document is being filed in the United States Patent and Trademark Office on or about the same day as the present application. This related application is: Hewlett-Packard docket number 100200823-1, Ser. No. 10/197,929, titled "DETECTION OF BIT ERRORS CONTENT ADDRESSABLE MEMORIES."

FIELD OF THE INVENTION

This invention relates generally to content-addressable memories (CAMs) and more particularly to detecting bit errors that may occur in the data stored in a CAM.

BACKGROUND

CAM structures perform pattern matches between a query data value and data previously stored in an entry of the CAM. A match causes the address of the matching entry to be output. Bit value errors may occur in CAM entries at any time due to external energy being imparted to the circuit. For example, an alpha particle strike may cause one of the storage elements in a CAM to change state. If this occurs, an incorrect query match may result causing an incorrect address to be output from the circuit. If the CAM address is used to drive a RAM, this error will also cause incorrect data to be output from the RAM. Since the contents of the CAM entries are typically not known external to the CAM, this incorrect (or false) query match may not be detected.

SUMMARY OF THE INVENTION

Parity and mask bit(s) are stored in a random access memory (RAM) that is coupled to a CAM. The parity and mask bits(s) are stored in conjunction with the CAM entry write. Upon a CAM query match, the reference parity bit(s) and mask bit(s) stored at the address output by the CAM are output from the RAM. These reference parity bit(s) are compared to parity bit(s) generated from a query data value that is masked by the retrieved mask bit(s). In the absence of a CAM or RAM bit error, the reference parity bit(s) from the RAM and the parity bit(s) generated from the masked query data will match. If a CAM or RAM bit error occurred, these two sets of parity bit(s) will not match and thus an error will be detected. This error may be used as an indication that a false CAM match has occurred.

DETAILED DESCRIPTION OF THE PREFERRED EMBODIMENTS

Figure 1:
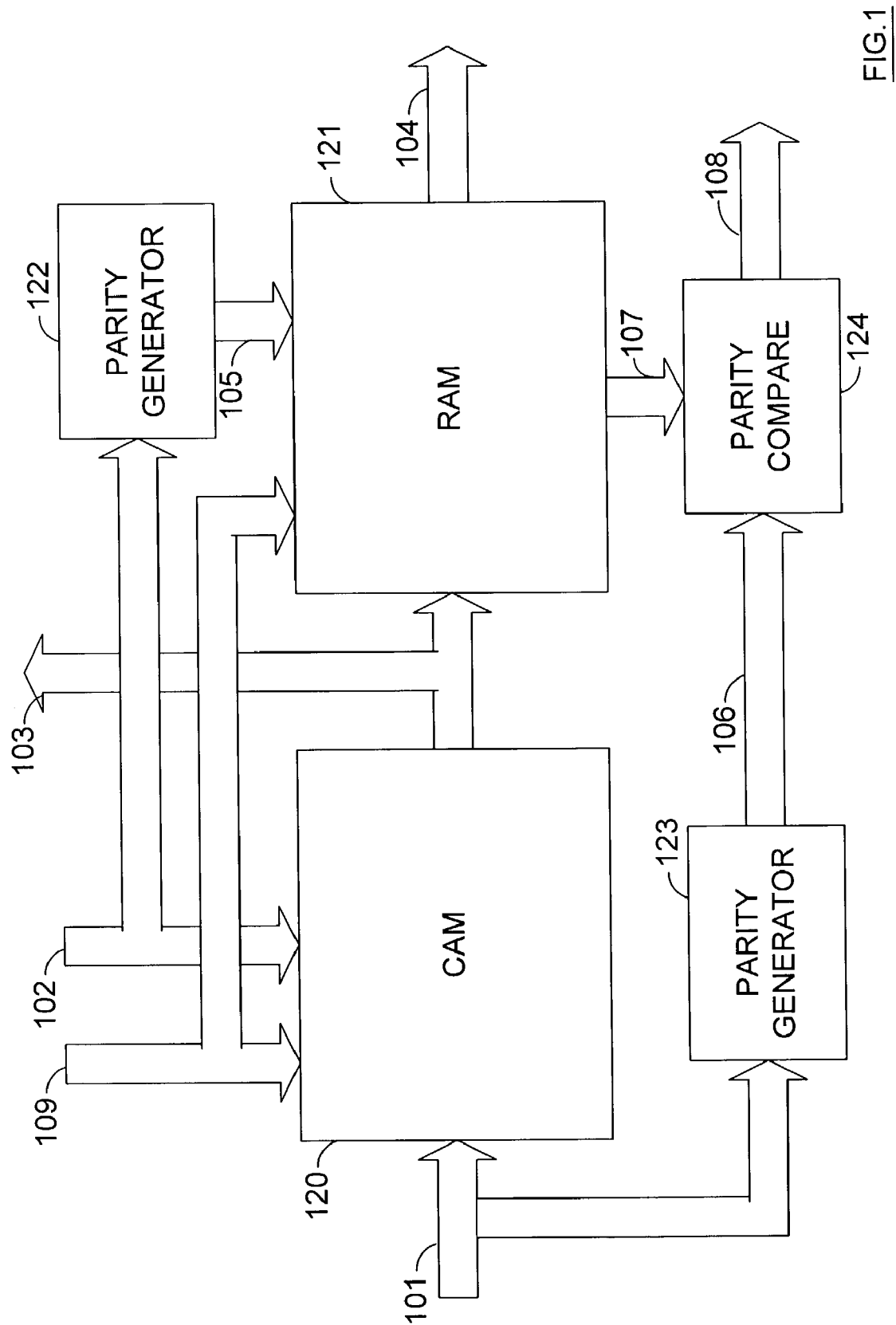
FIG. 1 is a block diagram illustrating the detection of CAM bit errors.

FIG. 1 is a block diagram illustrating the detection of CAM bit errors. In FIG. 1, arrow 102 represents data being written into CAM 120 at an address represented by arrow 109. Data 102 is also supplied to a parity generator 122. Parity generator 122 generates one or more input parity bits 105 from data 102. The input parity 105 generated by 122 may be a simple single bit parity such as odd or even parity, or a more complex multi-bit parity such as an error correcting code (ECC). The input parity bit(s) generated by parity generator 122 are represented by arrow 105. The input parity 105 is written into RAM 121 at an address corresponding to the address shown as arrow 109. Accordingly, after an entry is written in CAM 120 at a particular address, there will be a corresponding input parity entry stored in RAM 121 at a corresponding address.

When query data is supplied to CAM 120, CAM 120 may output the address that contains that query data, or indicate that that query data is not in the CAM. In FIG. 1, the query data is represented by arrow 101. This query data is also supplied to parity generator 123. In the case of a query match, the address being output by CAM 120 is represented by arrow 103. The address of the query match 103 is forwarded to RAM 121 to retrieve (at least) the parity stored in the RAM at the corresponding address. The stored parity output by the RAM is represented by arrow 107. Any additional data stored in RAM 121 at the corresponding address may also be output. This additional data is represented by arrow 104.

Parity generator 123 outputs query parity bit(s) represented by arrow 106. The query parity bit(s) 106 generated by parity generator 123 would typically be the same encoding as those produced by parity generator 122. However, it may differ from the encoding generated by parity generator 122 by certain inversions, or other transformations etc. depending upon the functioning of parity compare 124 and RAM 121. Parity bit(s) 106 and stored parity output 107 are compared by a comparator 124. The results of this compare 108 indicate whether or not there was a bit error in the queried entry in the CAM or in the stored parity corresponding to that entry.

Figure 2:
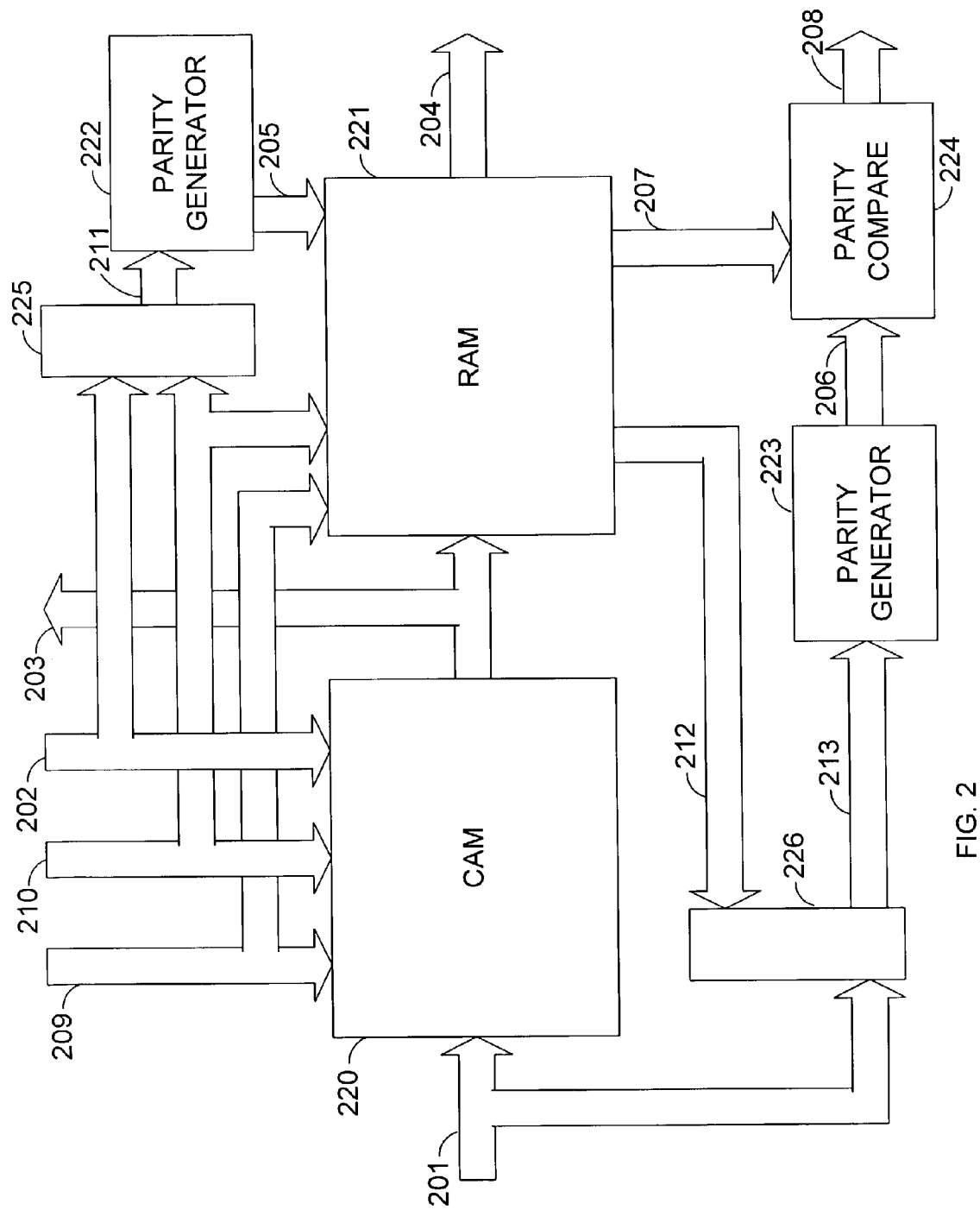
FIG. 2 is a block diagram illustrating the detection of CAM bit errors with maskable bits.

FIG. 2 is a block diagram illustrating the detection of CAM bit errors with maskable bits. In FIG. 2, arrow 202 represents data being written into CAM 220 at an address represented by arrow 209. Data 202 is also supplied to a mask block 225. Arrow 210 represents input mask bits. Input mask bits 210 are supplied to CAM 220, mask block 225, and RAM 221. Input mask bits 210 are stored in CAM 220 at the same address 209 as data 202 and tell CAM 220 which bits to consider or not consider when determining if a query matches the entry at address 209.

Mask block 225 takes data 202 and mask bits 210 and sets certain bits in data 202 to a predetermined value (i.e. logical 1 or 0). The bits that are set to this predetermined value are given by the values of mask bits 210. For example, if data 202 was four bits wide (and it could be any arbitrary length) and its binary value was "1100" and mask bits 210's binary value was "1010" (and 1 was chosen to mean pass, 0 to mean mask), mask block 225 may output "1000"—effectively masking bits 0 and 2 (numbering bits from right-to-left with bit 0 being the rightmost, bit 3 the leftmost) of data 202 to a logical 0. Data 202 could also have been masked to logical 1's making the mask block output 211 "1101". Mask block output 211 is supplied to parity generator 222.

Parity generator 222 generates one or more input parity bits 205 from mask block output 211. The input parity 205 generated by 222 may be a simple single bit parity such as odd or even parity, or a more complex multi-bit parity such as an error correcting code (ECC). Note that parity calculations should be limited to those bits which affect or control query matches. This is because errors in masked bits will not result in incorrect matches since masked bits are ignored when determining if there is a match. For example, if data bit 13 is masked in a CAM entry, the parity for that entry should be the same regardless of the value of bit 13 of the query data. Accordingly, bit 13 should be masked before the parity calculation related to that entry. The input parity bit(s) generated by parity generator 222 are represented by arrow 205. The input parity 205 is written into RAM 221 along with mask bits 210 at an address corresponding to the address shown as arrow 209. Accordingly, after an entry is written in CAM 220 at a particular address, there will be a corresponding input parity entry and mask bit entry stored in RAM 221 at a corresponding address.

When query data is supplied to CAM 220, CAM 220 may output the address that contains that query data 201, or indicate that that query data 201 is not in the CAM. In FIG. 2, the query data is represented by arrow 201. This query data is also supplied to mask block 226. In the case of a query match, the address being output by CAM 220 is represented by arrow 203. The address of the query match 203 is forwarded to RAM 221 to retrieve (at least) the parity and mask bits stored in the RAM 221 at the corresponding address. The stored parity output by the RAM is represented by arrow 207. The stored mask bits are represented by arrow 212. Any additional data stored in RAM 221 at the corresponding address may also be output. This additional data is represented by arrow 204.

Mask block 226 takes query data 201 and stored mask bits 212 and sets certain bits in query data 201 to a predetermined value (i.e. logical 1 or 0). The function of mask block 226 is similar to mask block 225. The output of mask block 226 is represented by arrow 213 and is supplied to parity generator 223.

Parity generator 223 outputs query parity bit(s) represented by arrow 206. The query parity bit(s) 206 generated by parity generator 223 would typically be the same encoding as those produced by parity generator 222. However, it may differ from the encoding generated by parity generator 222 by certain inversions, or other transformations etc. depending upon the functioning of parity compare 224, mask blocks 225 and 226, parity generators 222 and 223, and RAM 221. Parity bit(s) 206 and stored parity output 207 are compared by a comparator 224. The result of this compare 208 indicates whether or not there was a bit error in the queried entry in the CAM 221, the mask bits either in the CAM 221, or in the stored parity or mask bits corresponding to that entry.

Figure 3:
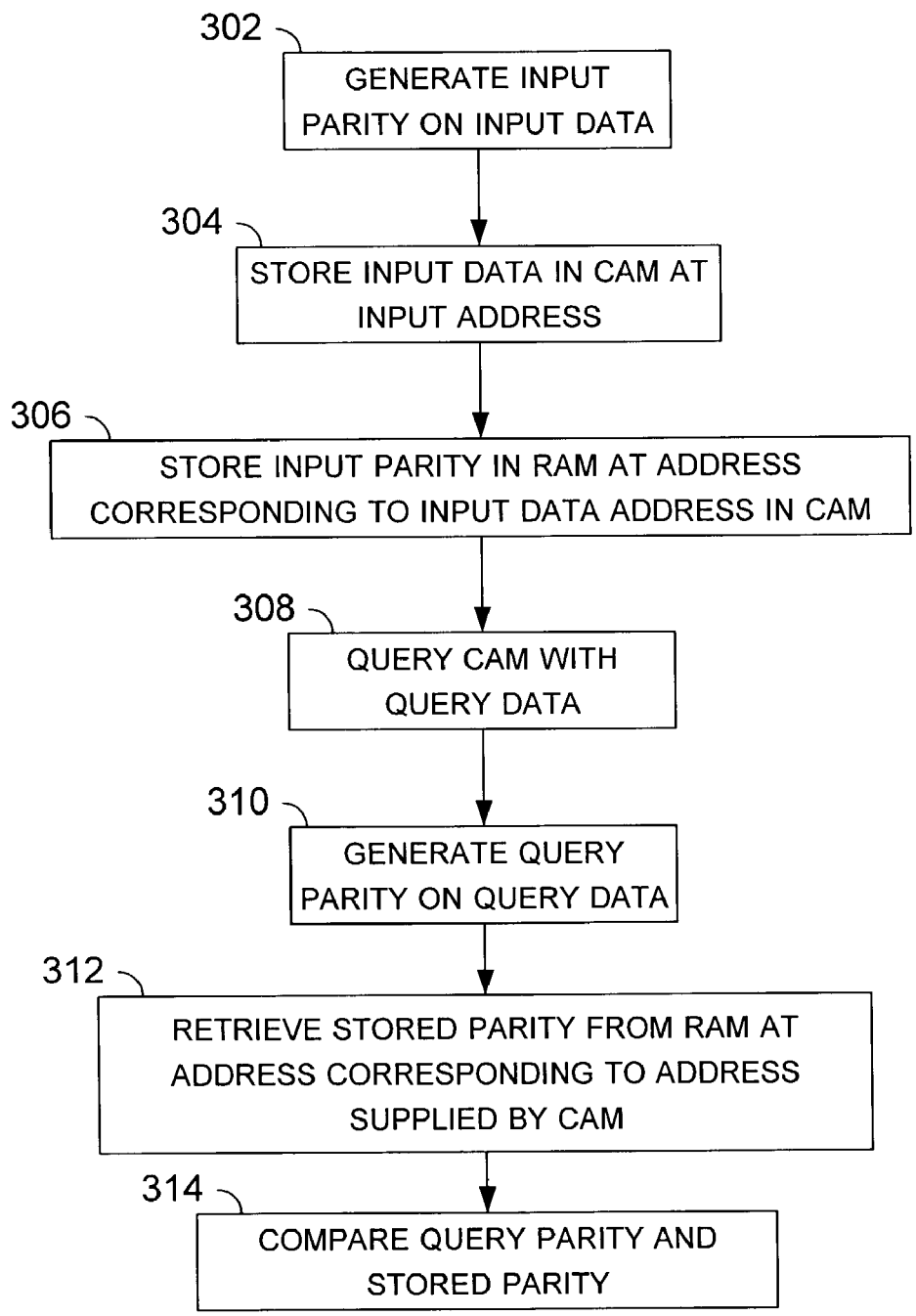
FIG. 3 is a flowchart illustrating steps to detect CAM bit errors.

FIG. 3 is a flowchart illustrating steps to detect CAM bit errors. These steps are applicable to the block diagram in FIG. 1, but are not limited to application with only that arrangement of blocks. Other arrangements of blocks may be used to complete these steps. In FIG. 3, in a step 302 input parity is generated on input data that is being written into the CAM. The generated input parity may be a simple single bit parity such as odd or even parity, or a more complex multi-bit parity such as an error correcting code (ECC). In a step 304, the input data is stored in a CAM at an input address. In a step 306, the input parity is stored in a RAM at an address that corresponds to the address the input data was stored at in the CAM. In other words, the input parity is stored at an address that, when a query matches in the CAM and the CAM outputs an address, the RAM will output the input parity when the address the CAM outputs is used either directly as an address or as an index to an address that is applied to the RAM's address inputs.

In a step 308, the CAM is queried by supplying the appropriate inputs of the CAM with query data. In a step 310, query parity is generated on the query data that is being applied to the CAM. This parity algorithm should produce a result that matches the algorithm used in step 302 or only differs by insignificant factors such as an inversion or other insignificant transformations. In a step 312, a stored parity is retrieved from the RAM by accessing a RAM location that corresponds to the address supplied by the CAM when it was queried in step 308. In a step 314, the generated query parity and the stored parity from the RAM are compared. If they match, no bit error in either the CAM contents or RAM stored parity contents has been detected. If they do not match, a bit error in either the CAM contents or RAM stored parity content has been detected.

Figure 4:
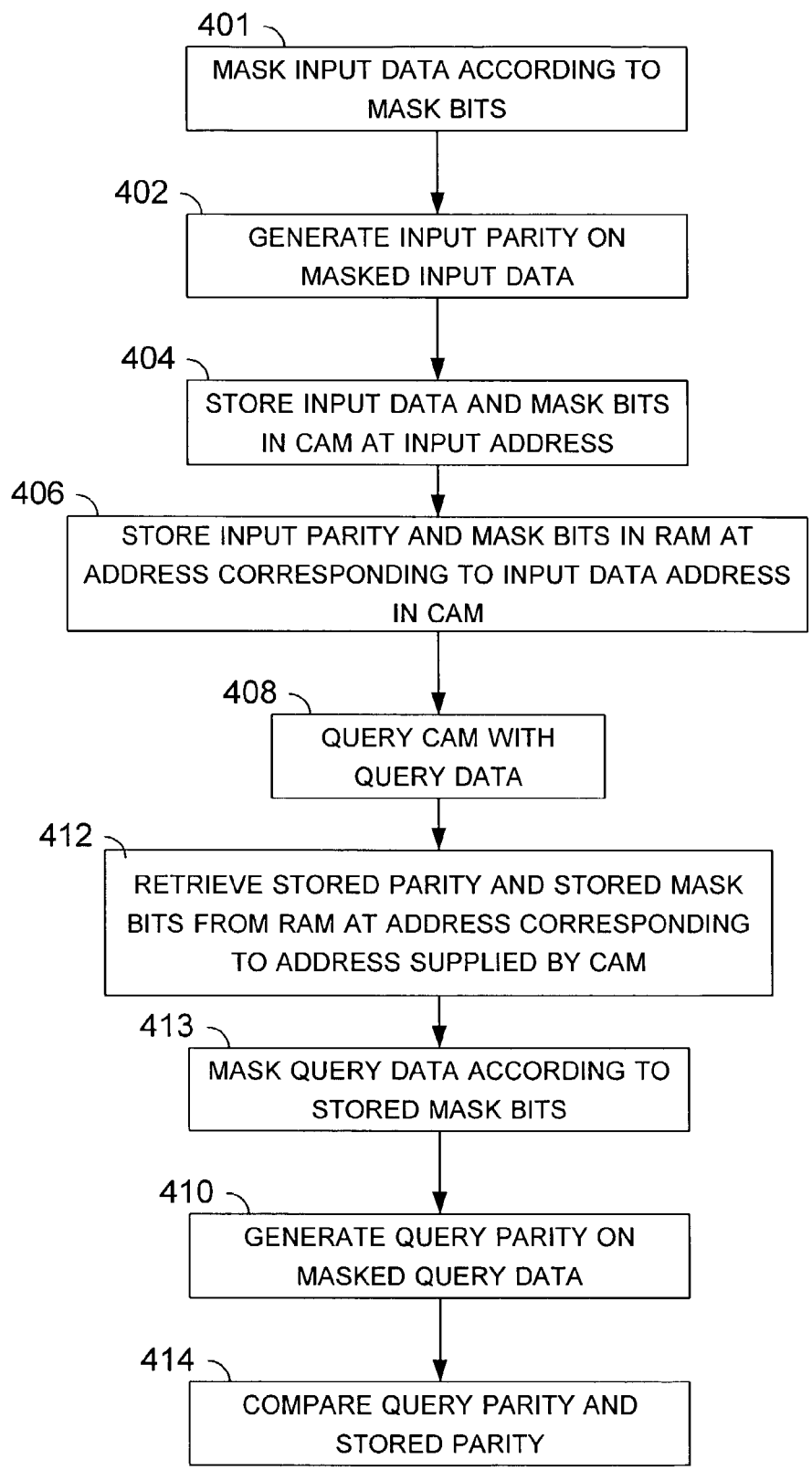
FIG. 4 is a flowchart illustrating steps to detect CAM bit errors in a CAM with maskable bits.

FIG. 4 is a flowchart illustrating steps to detect CAM bit errors in a CAM with maskable bits. These steps are applicable to the block diagram in FIG. 2, but are not limited to application with only that arrangement of blocks. Other arrangements of blocks may be used to complete these steps. In FIG. 4, in a step 401, the input data is masked according to a set of mask bits. In a step 402 input parity is generated on the masked input data from step 401. The generated input parity may be a simple single bit parity such as odd or even parity, or a more complex multi-bit parity such as an error correcting code (ECC). Note that parity calculations should be limited to those bits which affect or control query matches. For example, if data bit 13 is masked in a CAM entry, the parity for that entry should be the same regardless of the value of bit 13 of the query data. Accordingly, bit 13 should be masked before the parity calculation related to that entry. In a step 404, the input data and the set of mask bits are stored in a CAM at an input address. In a step 406, the input parity and the set of mask bits are stored in a RAM at an address that corresponds to the address the input data was stored at in the CAM. In other words, the input parity and mask bits are stored at an address that, when a query matches in the CAM and the CAM outputs an address, the RAM will output the input parity and mask bits when the address the CAM outputs is used either directly as an address or as an index to an address that is applied to the RAM's address inputs.

In a step 408, the CAM is queried by supplying the appropriate inputs of the CAM with query data. In a step 412, a stored parity and stored mask bits are retrieved from the RAM by accessing a RAM location that corresponds to the address supplied by the CAM when it was queried in step 408. In a step 413, the query data is masked according to the stored mask bits retrieved in step 412. In a step 410, query parity is generated on the masked query data from step 413. This parity algorithm should produce a result that matches the algorithm used in step 402 or only differs by insignificant factors such as an inversion or other insignificant transformations. In a step 414, the generated query parity and the stored parity from the RAM are compared. If they match, no bit error in either the CAM contents, or RAM stored parity contents, or RAM stored mask bits has been detected. If they do not match, a bit error in either the CAM contents, RAM stored parity contents, or stored mask bits has been detected.

One use of a CAM with or without mask bits is in a translation look-aside buffer or TLB. In this application, a virtual address (or portion thereof) is sent to the CAM. If a hit occurs, the CAM causes at least a portion of the physical address to be output by a RAM. A bit error in the CAM of a TLB may cause one of two things to happen. The first, is the bit error will prevent an otherwise valid TLB entry from getting hit (i.e. the bit error causes a TLB entry that should match not to match). In this case, since the replacement of entries in a TLB is often done on a least-recently used basis, the erroneous entry will eventually be replaced because it never matches. This type of bit error won't be detected. However, since the offending entry is eventually replaced or re-written, this type of bit error does not tend to cause serious problems. The second is a bit error that causes a TLB entry to match when it should not. This type of bit error can cause serious problems in the operation of the computer and, since it causes matches, may not be eventually replaced for lack of use. However, the methods and apparatus described above facilitate the detection of this type of bit error so that this entry may be invalidated, re-written, or otherwise handled before the bit error causes problems.

What is claimed is:

1. A method of detecting CAM bit errors, comprising:
   retrieving a stored parity from a RAM;
   retrieving a stored mask bits from said RAM
   generating a masked query parity by masking query data being used to query a CAM with said stored mask bits from said RAM; and,
   comparing said stored parity and said masked query parity.

2. The method of claim 1 wherein said step of retrieving a stored parity from said RAM and said step of retrieving a stored mask bits from said RAM comprise retrieving said stored parity and said stored mask bits from a RAM address that corresponds to a CAM output address being output by said CAM in response to said query data being used to query said CAM.

3. The method of claim 2 further comprising:
   generating an input parity on input data being stored in said CAM; and,
   storing said input parity and an input mask bits in said RAM.

4. The method of claim 3 wherein said CAM is part of a TLB.

5. A method of detecting CAM bit errors, comprising:
   querying a CAM with a first set of data;
   retrieving a second and a third set of data from a location corresponding to an address provided by said CAM in response to being queried with said first set of data;
   comparing parity generated from said first set of data after being masked by said second set of data to said third set of data.

6. The method of claim 5, comprising:
   storing a CAM entry comprising a fourth set of data at a CAM entry address in said CAM; and,
   storing a parity entry at a location corresponding to said CAM entry address.

7. The method of claim 6 wherein said parity entry is stored in a RAM.

8. The method of claim 7 wherein additional data is stored in said RAM.

9. The method of claim 8 wherein said additional data is part of a TLB entry.

10. A method of detecting CAM bit errors, comprising:
    generating and storing a parity on a CAM entry wherein said CAM entry is masked by a set of mask bits;
    storing said set of mask bits;
    querying a CAM for said CAM entry;
    retrieving said parity and said set of mask bits from an address supplied by said CAM; and,
    comparing said parity and a generated parity generated from data used to query said CAM that has been masked by said set of mask bits.

11. The method of claim 10 wherein said CAM is part of a TLB.

12. An apparatus for detecting CAM bit errors, comprising:
    means for generating and storing a first parity on a masked CAM entry;
    means for retrieving a second parity and a set of mask bits from an address supplied by said CAM when said CAM is queried;
    means for generating a third parity from data used to query said CAM that has been masked by said set of mask bits; and,
    means for comparing said second parity and said third parity.

13. An apparatus for detecting CAM bit errors, comprising:
    means for generating and storing a first parity on a masked CAM entry;
    means for retrieving said first parity and a set of mask bits from an address supplied by said CAM when said CAM is queried;
    means for generating a second parity from data used to query said CAM that has been masked by said set of mask bits; and,
    means for comparing said second parity and said first parity.

14. An apparatus, comprising:
    a CAM supplying an address to a RAM in response to a first set of data bits, wherein said RAM outputs a second set of data bits that include a first set parity bits and a set of mask bits;
    a parity generator that generates a second set of parity bits on a third set of data bits that is generated by masking said first set of data bits with said set of mask bits wherein said first set of data bits is querying said CAM; and,
    a parity comparator that compares said first set of parity bits and said second set of parity bits.

15. A TLB, comprising:
    a CAM;
    a RAM;
    a first parity generator;
    a second parity generator;
    a first bit masker;
    a second bit masker;
    a parity comparator wherein said first parity generator is coupled to a first input of said CAM and generates a first parity on data masked by said first bit masker according to a first bit mask and said first parity and said first bit mask are stored in said RAM at a second location that corresponds to said first location and said RAM outputs a third parity and a second bit mask when said CAM supplies said RAM an address in response to said data querying said CAM and said second parity generator generates a second parity on data masked by said second bit masker according to said second bit mask said parity comparator compares said second parity and said third parity to detect at least one bit error in either of said CAM and RAM.

16. A TLB, comprising:
    a CAM;
    a RAM;

a first parity generator;
a second parity generator;
a first bit masker;
a second bit masker;
a parity comparator wherein said first parity generator is coupled to a first input of said CAM and generates a first parity on data masked by said first bit masker according to a first bit mask and said first parity and said first bit mask are stored in said RAM at a second location that corresponds to said first location and said RAM outputs said first parity and said first bit mask when said CAM supplies said RAM an address in response to said data querying said CAM and said second parity generator generates a second parity on data masked by said second bit masker according to said second bit mask said parity comparator compares said second parity and said first parity to detect at least one bit error in either of said CAM and RAM.

17. A method of detecting false CAM matches, comprising:
retrieving a stored parity from a RAM;
retrieving a stored mask bits from said RAM
generating masked query parity by masking query data being used to query a CAM with said stored mask bits from said RAM; and,
comparing said stored parity and said masked query parity to detect a false CAM match.

18. The method of claim 17 wherein said step of retrieving said stored parity from said RAM and said step of retrieving said stored mask bits from said RAM comprise retrieving said stored parity and stored mask bits from a RAM address that corresponds to a CAM output address being output by said CAM in response to said query data being used to query said CAM.

19. The method of claim 18 further comprising:
generating input parity on input data being stored in said CAM; and,
storing said input parity and an input mask bits in said RAM.

20. The method of claim 19 wherein said CAM is part of a TLB.

* * * * *

UNITED STATES PATENT AND TRADEMARK OFFICE
CERTIFICATE OF CORRECTION

PATENT NO. : 7,100,097 B2  Page 1 of 1
APPLICATION NO. : 10/196763
DATED : August 29, 2006
INVENTOR(S) : Benjamin J. Patella et al.

It is certified that error appears in the above-identified patent and that said Letters Patent is hereby corrected as shown below:

In column 5, line 23, in Claim 1, delete "bits" and insert -- bit --, therefor.

In column 5, line 25, in Claim 1, delete "bits" and insert -- bit --, therefor.

In column 5, line 31, in Claim 2, delete "bits" and insert -- bit --, therefor.

In column 5, line 32, in Claim 2, delete "bits" and insert -- bit --, therefor.

In column 5, line 39, in Claim 3, delete "bits" and insert -- bit --, therefor.

In column 7, line 22, in Claim 17, delete "bits" and insert -- bit --, therefor.

In column 8, line 2, in Claim 17, delete "bits" and insert -- bit --, therefor.

In column 8, line 8, in Claim 18, delete "bits" and insert -- bit --, therefor.

In column 8, line 9, in Claim 18, delete "bits" and insert -- bit --, therefor.

In column 8, line 17, in Claim 19, delete "bits" and insert -- bit --, therefor.

Signed and Sealed this

Third Day of March, 2009

JOHN DOLL
*Acting Director of the United States Patent and Trademark Office*